US006680440B1

United States Patent
Russell et al.

(10) Patent No.: US 6,680,440 B1
(45) Date of Patent: Jan. 20, 2004

(54) CIRCUITIZED STRUCTURES PRODUCED BY THE METHODS OF ELECTROLESS PLATING

(75) Inventors: David John Russell, Apalachin, NY (US); Gerald Walter Jones, Apalachin, NY (US); Heike Marcello, Brackney, PA (US); Voya Rista Markovich, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 855 days.

(21) Appl. No.: 09/027,856

(22) Filed: Feb. 23, 1998

(51) Int. Cl.[7] .................................................. H05K 1/16
(52) U.S. Cl. ...................... 174/260; 174/261; 174/262; 427/126.5
(58) Field of Search ................................ 174/250, 262, 174/260, 261

(56) References Cited

U.S. PATENT DOCUMENTS

| 3,982,045 A | 9/1976 | Kukanskis | 427/98 |
| 4,097,684 A | * 6/1978 | Burr | 174/262 |

(List continued on next page.)

FOREIGN PATENT DOCUMENTS

| GB | 2 301 826 A | 12/1996 |
| JP | 60-106191 A | 11/1983 |
| JP | 63-126775 | 5/1988 |
| JP | 2-279718 A | 11/1990 |
| JP | 4-318993 A | 4/1991 |

OTHER PUBLICATIONS

"Improved Composition for a Dry Film Soldermask", IBM Technical Disclosure Bulletin, vol. 33, No. 7, Dec. 1990, p. 162–163.

"Formation of Surface Laminar Circuit on Printed Circuit Board with Plated Through Holes", IBM Technical Disclosure Bulletin, vol. 36, No. 10, p. 511, Oct. 1993.

"Making Integral Multilayer Circuit Boards with Cable Connection", IBM Technical Disclosure Bulletin, vol. 14, No. 3, pp. 701–702, Aug. 1971.

*Primary Examiner*—Kamand Cuneo
*Assistant Examiner*—I B Patel
(74) *Attorney, Agent, or Firm*—William N. Hogg

(57) ABSTRACT

The present invention provides new methods for electroless plating of metal particularly gold and copper onto substrates, such as circuitized substrates, which reduces processing steps, reduces metal consumption, and reduces the scraping of parts due to contamination. The method employs a permanent plating resist. The method for electrolessly plating metal onto a substrate, including the following steps: providing: an uncured, photoimagable, dielectric permanent plating resist comprising: from about 10 to 80% of phenoxy polyol resin which is the condensation product of epichlorohydrin and bisphenol A, having a molecular weight of from about 40,000 to 130,000; from about 20 to 90% of an epoxidized multifunctional bisphenol A formaldehyde novolac resin having a molecular weight of from about 4,000 to 10,000; from 0 to 50% of a diglycidyl ether of bisphenol A having a molecular weight of from about 600 to 2,500; and from about 0.1 to 15 parts by weight of the total resin weight, a cationic photoinitiator; applying the permanent plating resist on the substrate; photopatterning the permanent plating resist to form apertures therein which expose areas of the substrate; and electrolessly plating metal onto the exposed areas of the substrate. The permanent plating resist is useful to protect the substrate areas including for example metallized features on the substrate, from the electroless deposition of metal during electroless plating; thus selective plating of metal is achieved. The permanent plating resist is not degraded by conventional gold or copper electroless baths. The invention also relates to circuitized structures produced by the methods of electroless plating.

20 Claims, 1 Drawing Sheet

U.S. PATENT DOCUMENTS

| | | | |
|---|---|---|---|
| 4,451,550 A | 5/1984 | Bennett et al. | 430/176 |
| 4,701,351 A | 10/1987 | Jackson | 427/98 |
| 4,820,549 A | 4/1989 | Ozaki et al. | 427/98 |
| 4,867,839 A | 9/1989 | Sato et al. | 156/630 |
| 4,882,245 A | 11/1989 | Gelorme et al. | 430/14 |
| 4,911,786 A | 3/1990 | Kindl et al. | 156/659.1 |
| 4,940,651 A | 7/1990 | Brown et al. | 430/325 |
| 4,983,252 A | 1/1991 | Masui et al. | 156/630 |
| 4,994,346 A | 2/1991 | Meier et al. | 430/280 |
| 5,026,624 A | 6/1991 | Day et al. | 430/280 |
| 5,079,129 A | 1/1992 | Roth et al. | 430/280 |
| 5,208,067 A | 5/1993 | Jones et al. | 427/96 |
| 5,246,817 A | 9/1993 | Shipley, Jr. | 430/312 |
| 5,264,325 A | 11/1993 | Allen et al. | 430/280 |
| 5,278,010 A | 1/1994 | Day et al. | 430/18 |
| 5,300,402 A | 4/1994 | Card, Jr. et al. | 430/280 |
| 5,304,457 A | 4/1994 | Day et al. | 430/280 |
| 5,397,685 A | 3/1995 | Daniels et al. | 430/325 |
| 5,439,766 A | 8/1995 | Day et al. | 430/18 |
| 5,443,672 A | 8/1995 | Stoll et al. | 156/244.17 |
| 5,557,844 A | 9/1996 | Bhatt et al. | 29/852 |
| 5,654,126 A | 8/1997 | Kukanskis et al. | 430/312 |
| 5,667,934 A | 9/1997 | Markovich et al. | 430/280.1 |
| 5,741,575 A * | 4/1998 | Asai et al. | 428/209 |

* cited by examiner

US 6,680,440 B1

CIRCUITIZED STRUCTURES PRODUCED BY THE METHODS OF ELECTROLESS PLATING

BACKGROUND OF THE INVENTION

In the manufacture of printed wiring boards and laminate chip carriers it is advantageous to use electroless plating to plate copper and gold. Electroless copper plating enables lines, tabs, and pads to be manufactured without commoning bars employed in electrolytic plating and without plating a full layer of copper. Electroless copper pattern plating involves depositing a seed layer, then applying a resist to mask areas that are not to be plated. However, the resist must be capable of withstanding the hot alkaline electroless plating bath; and provide high resolution to provide fine line circuitry. Few resists meet both requirements. Moreover, if a resist is employed, the resist and the seed are typically stripped before further processing.

Electroless plating of gold is employed in many of the newer high technology printed wiring boards and laminate chip carriers, to protect structures such as SMT and wirebond pads from oxidation during processing. Not all products can be commoned and electrolytically plated with gold, so electroless gold plating is employed. Conventional resist materials or masking materials are not suitable for electroless plating of gold because they lack sufficient resolution to mask wirebond tabs and fine pitch SMT pads, or they are not chemically compatible with the electroless gold plating bath. The gold electroless plating bath either degrades the resist so that it lifts off, or leaches materials into the bath which interfere with the electroless plating. In an attempt to avoid these problems, a resist is typically not used; gold is electrolessly plated on all metal features of the product. After the metal is electrolessly plated, a solder mask is applied to protect the circuits during subsequent soldering operations.

However, such an approach unnecessarily consumes gold since gold is plated to areas where the gold is not required. Furthermore, processing and handling of circuitized products after the gold plating step, stains and contaminates the gold pads; this in turn results in scraping of defective products. Moreover, many soldermasks do not adhere well to the plated gold layer.

It would be desirable to have a method for selectively electrolessly plating gold which does not require that the gold be plated over all the metal features of the substrate. It would also be desirable to have a method for selectively plating electroless plating copper.

SUMMARY OF THE INVENTION

The present invention provides new methods for electroless plating of metal particularly gold and copper onto substrates, such as circuitized substrates, which reduces processing steps, reduces metal consumption, and reduces the scraping of parts due to contamination. The method employs a permanent plating resist. The method for electrolessly plating metal onto a substrate, comprises the following steps: providing: an uncured, photoimagable, dielectric permanent plating resist comprising epoxy resin system comprising: from about 10 to 80% of phenoxy polyol resin which is the condensation product of epichlorohydrin and bisphenol A, having a molecular weight of from about 40,000 to 130,000; from about 20 to about 90% of an epoxidized multifunctional bisphenol A formaldehyde novolac resin having a molecular weight of from about 4,000 to 10,000; from about 35% to about 50% of a diglycidyl ether of bisphenol A having a molecular weight of from about 600 to about 2,500; and from about 0.1. to 15 parts by weight of the total resin weight, a cationic photoinitiator; applying the permanent plating resist on the substrate; photopatterning the permanent plating resist to form apertures therein which expose areas of the substrate; and electrolessly plating metal onto the exposed areas of the substrate.

The permanent plating resist is useful to protect the substrate areas including for example metallized features on the substrate, from the electroless deposition of metal during electroless plating; thus selective plating of metal is achieved. The permanent plating resist is not degraded by conventional gold or copper electroless baths. The invention also relates to circuitized structures produced by the methods of electroless plating.

DETAILED DESCRIPTION OF THE INVENTION

Figure 1:
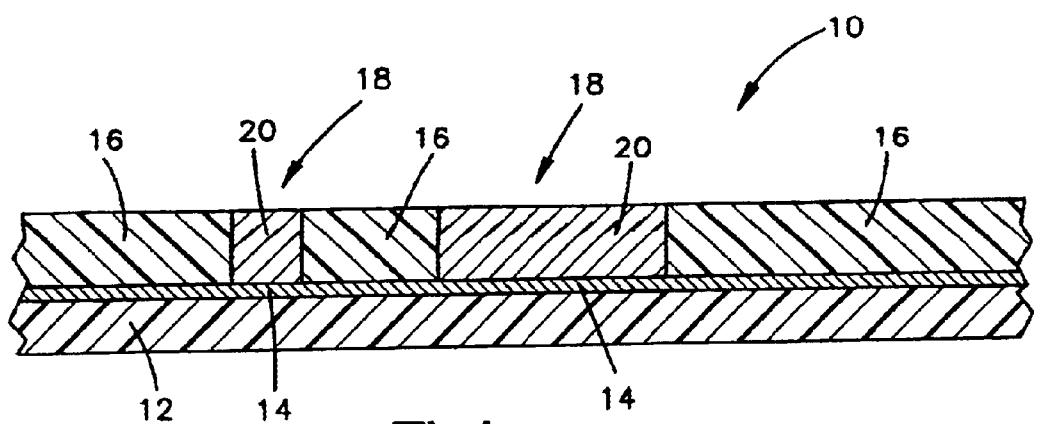
FIG. 1 is a cross section of a typically circuitized structure produced by the electroless plating of copper according to the methods of the present invention.

The present invention provides new methods for electroless plating of metal, particularly gold and copper onto substrates, particularly circuitized substrates, which reduces processing steps, reduces gold consumption, and reduces the scraping of parts due to contamination. The permanent plating resist is not degraded by electroless plating baths, which typically subject workpieces to stringent, hot alkaline conditions.

It has been discovered that the solder mask compositions (U.S. Pat. Nos. 5,026,624; 5,278,010; 5,300,402 and related patents) is useful as a permanent plating resist; it is compatible with electroless plating baths, particularly copper baths and gold baths, and is therefore useful as a plating resist. This allows fine lines and fine pitch pads to be plated electrolessly. This is particularly advantageous in microvia build up technology where multiple layers may be used and a more planer surface is desired.

The permanent plating resist acts as a structural component in the circuitized substrate, that is, the permanent plating resist can function as a dielectric layer or solder mask; there is no need to remove the permanent plating resist. Accordingly, the steps of stripping the resist and of stripping the seed are eliminated during the electroless plating of copper.

For electroless plating of copper, the seed is preferably applied to the entire surface of the substrate, then the permanent plating resist is applied over the seeded substrate so that the permanent plating resist covers the seed layer. The permanent plating resist is photopatterned that is, exposed to actinic radiation, and developed, using conventional techniques to reveal the areas of seed which are to be electrolessly plated. The workpiece is then electrolessly plated with copper and the copper is deposited on the seeded areas not covered by the permanent plating resist. Alternatively, for the electroless plating of copper, seed is selectively applied to the surface, of the substrate, using conventional techniques. The permanent plating resist is then applied over the substrate to cover both the seed and unseeded areas. The permanent plating resist is exposed and developed using conventional techniques to reveal those areas having seed deposited thereon. The piece is then electrolessly plated with copper and the copper is deposited on the seeded areas.

The electroless plating of gold typically is onto an immersion gold surface disposed on nickel plated copper features; thus a seeding step is not required. The permanent plating resist is photoimaged to reveal only those portions of the underlying copper features which require gold plating, some of which will also serve as sites to receive solder in subsequent solder operations. The workpiece is then electrolessly plated with gold. As a result, gold is selectively, electrolessly plated. Moreover, the permanent plating resist, in addition to acting as a resist for gold electroless plating, can withstand the temperatures employed in solder operations. Thus the resist functions as a solder mask.

Since the permanent plating resist functions as both the gold plating resist and the solder mask, this eliminates the need for employing two different materials in the fabrication of circuitized substrates. Accordingly, the steps involved in the stripping of a plating resists are avoided, as are the steps of applying a solder mask.

Since the permanent plating resist can act as a structural component in the circuitized substrate, that is the permanent plating resist can function as a dielectric layer, there is no need to remove the permanent plating resist. More significantly, the method of the present invention permits gold to be electrolessly plated as the last step in producing the circuitized substrate, such as printed wiring boards. More specifically, the step of developing the photoresist which often contaminates gold, is performed before gold is plated.

This simplifies the fabrication process of the circuitized substrate, and increases the yield by reducing the contamination of the surface of the gold pads, such as stains, by eliminating resist processing and handling after the gold is plated.

Where the permanent plating resist is utilized in the dry film form, it offers the further advantage of reducing, if not eliminating, the plugging of holes, such as via holes, such as occurs when liquid resist or paste resist runs into the holes. Thus, the permanent plating resist in dry film form also improves yields by eliminating hole plugging defects.

The permanent plating resist in dry film form can also be employed to cover or "tent" holes thereby eliminating hole filling operations which are expensive and inconvenient. Tenting is not typically employed in the electroless plating of copper; tenting is more commonly employed in the process of electrolessly plating gold.

The Permanent Plating Resist

The permanent plating resist is a high resolution dielectric material. Suitable photoimageable compositions for making the permanent plating resist are disclosed in U.S. Pat. No. 5,026,624 to Day, et. al., issued Jun. 25, 1991 and U.S. Pat. No. 5,30,402 to Card, et al., issued Apr. 5, 1994; U.S. Pat. No. 5,264,325 to Allen, et al., issued Nov. 23, 1993, which are specifically incorporated herein by reference. Preferably the dielectric constant of the permanent plating resist is less than about 5, more preferably less than about 4.

The permanent plating resist of the preferred embodiment is comprised of solids and solvent. The solids, comprise an epoxy resin system which is preferably comprised of: from about 10% to 80%, preferably from 20 to 40%, more preferably from about 25% to about 35% of phenoxy polyol resin which is the condensation product of epichlorohydrin and bisphenol A, having a molecular weight of from about 40,000 to 130,000, preferably about 60,000 to 90,000, more preferably greater than 60,000; from about 20 to about 90%, preferably from about 25% to about 30%, more preferably from about 25% to about 30%, most preferably about 25%, of an epoxidized multifunctional bisphenol A formaldehyde novolac resin having a molecular weight of from about 4,000 to 10,000, preferably about 5,000 to 7,000; from about 35% to about 50%, preferably from about 40 to 45%, more preferably about 45%, of a diglycidyl ether of bisphenol A having a molecular weight of from about 600 to 2,500, preferably about 1,000 to 1,700; and from about 0.1 to 15 parts, preferably about 5 parts, by weight of the total resin weight, a cationic photoinitiator. The diglycidyl ether of bisphenol A is preferably halogenated, more preferably brominated. The solvent component of the permanent plating resist preferably is comprised of propyleneglycol monomethyl ether acetate and 0 to less than about 10% propylene carbonate. The propylene carbonate is preferably the carrier for the preferred photoinitiator.

Preferably the phenoxy polyol resin has an epoxide value of from about 0.001 to about 3, more preferably from about 0.01 to about 0.3, most preferably about 0.03 equivalents per kg, a weight per epoxide of from about 10,000 to about 60,000, more preferably from about 20,000 to about 50,000, most preferably about 37,000 and a glass transition temperature of from about 80 to about 150 more preferably from about 90 to about 110, most preferably about 98° C.

Preferably, the multifunctional epoxy bisphenol A formaldehyde novolac resin has an epoxide value of from about 1 to about 10 more preferably from about 3 to about 6, most preferably about 4.7 equivalents per kilogram, a weight per epoxide of from about 180 to about 300, more preferably from about 190 to about 230, most preferably about 215 and a melting point of from about 60° C. to about 150° C., more preferably from about 70° C. to about 90° C., most preferably about 82° C.

Preferably, the diglycidyl ether of the bisphenol A, has an epoxide value of from about 0.1 to about 5, more preferably from about 1 to about 3, most preferably about 1.5 equivalents per kilogram, a weight per epoxide of from about 200 to about 1000, more preferably from about 500 to about 750, most preferably about 675 and a melting point of from about 70° C. to about 150° C., more preferably from about 80° C. to about 110° C., most preferably about 97° C.

A suitable phenoxy polyol resin is available under the trade name. "PKHC", formerly available from Union Carbide Corporation, now available from Phenoxy Resin Associates. A suitable octafunctional bisphenol A formerly available under the trade name Epirez SU-8 from High Tek Polymers, is now available as "Epon SU8" from Shell Chemical Company. A suitable tetrabromobisphenol A formerly available under the trade name "Epirez 5183" from High Tek Polymers, is now available as "Epon 1183" from Shell Chemical Company. A suitable complex triarylsulfonium hexafluoroantimonate salt photoinitiator formerly available under the trade name UVE 1014 from General Electric Company, is now available as UVI 6974 from Union Carbide Company.

The permanent plating resist is thermally stable particularly at electroless bath temperatures; the permanent plating resist is known to withstand gold electroless plating bath conditions at pH 14, at least 60° C. for 45 minutes and to withstand copper electroless plating bath conditions at pH 11, at least 73° C. for 10 hours.

The permanent plating resist dry film, in the steps before photo-imaging, preferably has an solvent content in an amount sufficient to prevent cracking and provide plasticity to the permanent plating resist dry film during handling. The solvent content in the permanent plating resist dry film prior to application to the substrate, preferably ranges from about 5 to 30%, by weight, more preferably from about 9 to 15%, most preferably from about 11 to 13.5%.

While the method has been described herein as employing the permanent plating resist dry film, the permanent plating resist can also be applied in liquid form or paste form, using conventional application methods such as, for example curtain coating, screen coating, roller coating or spray coating.

The Method

A substrate is provided such as for example, non-circutized power cores, stiffeners, circuitized substrates such as circuit boards, cards, carriers, organic and inorganic single chip modules, organic or inorganic multi-chip modules, ceramic carriers and interposer cards.

The Seed Process

Processes for depositing seed on a dielectric surface for plating, are conventional and are described in U.S. Pat. No. 4,448,804 to Amelio, et al. The surface of the substrate, which is dielectric, is typically cleaned with an alkaline solution. A multi-functional ionic copolymer is optionally deposited on the dielectric surface to enhance seed coverage and adhesion. Next, the seeder is deposited by conventional techniques such as by immersing the workpiece in a colloidal seed bath. Finally, the composition of the seeder is optionally altered by treatment with an acid or base solution. Preferably, the seed employed herein is conventional seed such as palladium.

Application of the Permanent Plating Resist

Preferably, the permanent plating resist is applied as a dry film; preferably the permanent plating resist dry film is provided on a polymeric support, such as polyester. Suitable polyester support for the permanent plating resist dry film, includes, for example, polyethylene terephthalate available under the trade name Mylar®, from DuPont, and Melinex from ICI.

The permanent plating resist dry film preferably has an solvent content in an amount sufficient to prevent cracking and provide plasticity to the permanent plating resist film during handling. To apply the permanent plating resist dry film, it is placed film-side down and the support is removed. After the permanent plating resist dry film is applied to the substrate, the permanent plating resist film is dried, then photoimaged or simply photoimaged without drying depending on whether or not tenting is desired. That is, if tenting of holes is desired, the support is preferably not peeled until after exposure to ultraviolet light, and the permanent plating resist film is not dried prior to exposure to ultraviolet light. Alternatively, if the holes are not to be tented, the solvent is driven off from the permanent plating resist dry film, to provide a solvent content preferably less than about 8%, more preferably less than about 3% before photoimaging. The permanent plating resist dry film is air dried, or to hasten the removal of the solvent, it is heated using conventional techniques. Preferably, the permanent plating resist film is heated at between 50° C. to 150° C., more preferably between 90° C. to 125° C. in conventional convection oven.

The permanent plating resist is then photoimaged using conventional techniques. Preferably, the permanent plating resist is exposed to ultraviolet light through desired artwork which is preferably in contact with the permanent plating resist, to expose areas corresponding to the position of the desired location of the metal to be plated. The permanent plating resist is then baked to partially cure the permanent plating resist which has been exposed to the actinic radiation.

The permanent plating resist is then developed, preferably using propylene carbonate or butyrolactone to provide a photoimaged permanent plating resist, in which the permanent plating resist has apertures disposed therein. The permanent plating resist is then finally cured, preferably in a two step process, first involving an exposure to ultraviolet light in the range of 250 to 400 nm, at from about 1 to about 8 $J/cm^2$, followed by a thermal cure. Good thermal cures have been obtained in a convection oven at 150° C. to 180° C. for 30 to 90 minutes. Thereafter the metal is electrolessly plated, by conventional techniques.

Electroless Plating of Copper

Where copper is the metal to be plated, the substrate is first seeded as described, and the permanent plating resist is applied and patterned as described. The substrate is placed in a copper electroless plating bath. Typically, copper electroless plating baths have a pH of at least 11, and a temperature of at least about 70° C. A typical bath contains a caustic agent typically, sodium hydroxide, formaldehyde and a copper source such as copper sulfate.

As a result of the electroless plating, copper is plated onto the areas of the substrate that are seeded and which areas lie within the photoimaged apertures in the permanent plating resist; the electrolessly plated copper forms circuitry which is disposed on the substrate and disposed within the apertures in the permanent plating resist. Thereafter the resist remains on the. substrate.

Electroless Plating of Gold

The substrate is placed in a gold electroless plating bath. Typically gold electroless plating baths have a pH of about 14, and a temperature of about 70° C. The gold bath typically contains dimethyl amino borane and caustic agents. As a result of the electroless plating, gold is plated onto the metal features of the substrate which lie below the photoimaged apertures in the permanent plating resist. The permanent plating resist remains on the substrate and acts as a solder mask in subsequent processing steps.

Various electrical components such as for example, surface mount components, connectors, resistors, inductors, capacitors, ball grid array packages, wire attach devices, semiconductor devices such as for example, chips, are attached, preferably by soldering, to the circuitized structure, preferably by conventional techniques. The permanent plating resist can withstand temperatures of soldering process such as at least about 183° C., for at least 20 minutes and even at least about 245° C. for at least about 1 minute.

As a result of the methods of the present invention, the circuitized structure is produced. As shown in FIG. 1, the circuitized structure 10, is comprised of: substrate 12, optionally seed 14, disposed on substrate 12, a cured photoimaged, dielectric permanent plating resist 16, having photopatterned apertures 18, and electrolessly plated metal, preferably copper 20 disposed on substrate 12.

Figure 2:
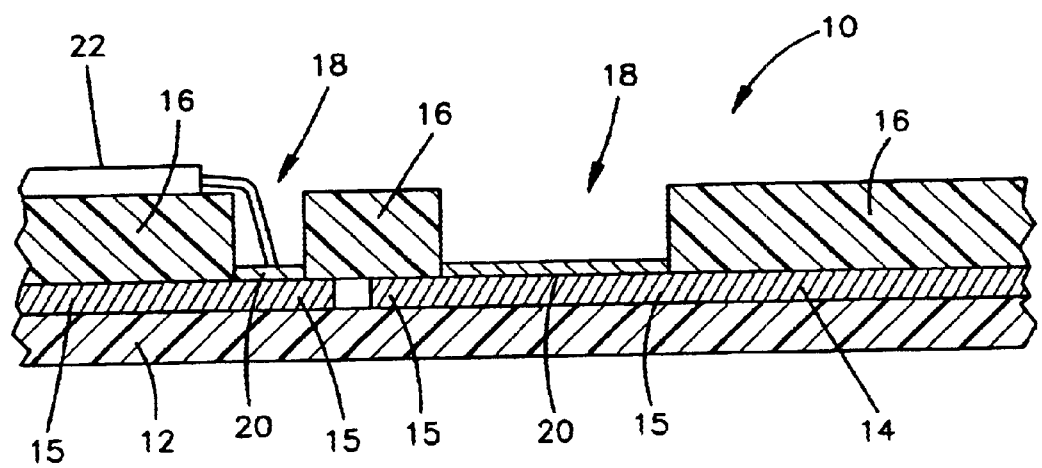
FIG. 2 is a cross section of a typically circuitized structure produced by the electroless plating of gold according to the methods of the present invention.

As shown in FIG. 2, the circuitized structure 10, is comprised of: substrate 12, circuitry 15 disposed on substrate 12, a cured photoimaged, dielectric permanent plating resist 16, having photopatterned apertures 18, and electrolessly plated metal 20 disposed in apertures 18 and on circuitry 14. The electrical component 22 is electrically connected to the circuitization 14 on the substrate 12.

The resulting circuitized structures produced by the methods of the present invention include for example, circuit boards, cards, carriers, organic and inorganic single chip modules, organic or inorganic multi-chip modules, ceramic carriers and interposer cards.

The following examples are illustrative and not intended to limit the scope of the invention.

EXAMPLE 1

Electroless Plating of Copper

The photoimageable permanent plating resist was provided having a solids content of from about 86.5 to 89%, such solids comprising: about 27.44% PKHC a phenoxy resin; 41.16% of Epirez 5183 a tetrabromobisphenol A; 22.88% of Epirez SU-8, an octafunctional epoxy bisphenol A formaldehyde novolac resin, 4.85% UVE 1014 photoinitiator; 0.07% ethylviolet dye; 0.03% FC 430 a fluorinated polyether nonionic surfactant from 3 M Company; 3.85% Aerosil 380, an amorphous silicon dioxide from Degussa. The solvent content was from about 11 to 13.5% of the total permanent plating resist weight. The solvent was a mixture of methyl ethyl ketone, propylene carbonate and propylene glycol monomethyl ether acetate. About 2.8 mil thick photoimageable dielectric permanent plating resist film was on 1.42 mil thick polyethylene terephthalate support designated Mylar D from Dupont.

A printed epoxy glass laminate substrate, having plated through holes, was immersed with palladium tin colloid seed bath for about 2 minutes, rinsed, dipped in sodium hydroxide accelerator bath, rinsed and dried. The permanent plating resist dry film was then placed film side down onto both sides of the printed epoxy glass laminate. The permanent plating resist dry film was laminated using a Dynachem model 730 vacuum laminator for about 15 seconds. The polyethylene terephthalate support was then peeled from the permanent plating resist dry film and dried at about 90° C. for about 30 minutes. The permanent plating resist dry film was then photoimaged at 1600 mJ/cm$^2$, and baked at about 125° C. for about 30 minutes.

The permanent plating resist is then developed, using propylene carbonate or butyrolactone to reveal areas for lines to be plated. The permanent plating resist was then finally cured, by an exposure to ultraviolet light in the range of 250 to 400 nm, at about 4 J/cm$^2$, followed by a bake at about 180° C. for about 60 minutes in a convection oven. The workpiece was then deposited in a copper electroless bath containing sodium hydroxide, formaldehyde, and copper sulfate at pH 11 for about 10 hours.

The permanent plating resist was examined after the immersion in the plating bath; the permanent plating resist was intact. Microscopic examination at 30× revealed no bubbling, and no lifting. The electroless plating bath was not contaminated.

EXAMPLE 2

Electroless Plating of Gold

The photoimageable permanent plating resist was provided as in Example 1. A substrate, a panel having copper circuitry and copper plated through holes was employed. The substrate was immersed in a reducing chlorite bath and the permanent plating resist film was laminated to both sides. The permanent plating resist film was photoimaged as in Example 1, the support was removed, baked at about 125° C. for 30 minutes, and the permanent plating resist film was developed and cured as in Example 1, to provide apertures in permanent plating resist disposed above copper areas to be plated. The photoimaged apertures were cleaned with permanganate followed by etching.

The printed epoxy glass laminate substrate was then placed in a conventional gold electroless plating bath containing dimethyl amino borane, at 60° C., pH 14 for about 45 minutes, rinsed, and then dried.

The permanent plating resist was examined after the immersion in the plating bath; the permanent plating resist was intact. Microscopic examination at 30× revealed no bubbling, and no lifting of the photoresist. The electroless plating bath was not contaminated.

Although certain embodiments of this invention have been shown and described, various adaptations and modifications can be made without departing from the scope of the invention as defined in the appended claims.

What is claimed is:

1. A method for electrolessly plating comprising the following steps:
   a. providing:
      an uncured, photoimagable, dielectric, permanent plating resist comprising an epoxy resin system comprising:
         from about 10 to 80% of phenoxy polyol resin which is the condensation product of epichlorohydrin and bisphenol A, having a molecular weight of from about 40,000 to 130,000;
         a. from about 20 to 90% of an epoxidized multifunctional bisphenol A formaldehyde novolac resin having a molecular weight of from about 4,000 to 10,000;
         from 0 to 50% of a diglycidyl ether of bisphenol A having a molecular weight of from about 600 to 2,500; and
         from about 0.1 to 15 parts by weight of the total resin weight, a cationic photoinitiator;
   b. applying seed to the substrate;
   c. then applying the permanent plating resist to the substrate;
   d. photoimaging the permanent plating resist to form apertures in the permanent plating resist; and
   e. electrolessly plating metal into the apertures in the permanent plating resist wherein the metal is plated onto the seed.

2. The method of claim 1, wherein the metal is copper.

3. The method of claim 2, wherein the seed is applied to substantially the entire surface of the substrate.

4. The method of claim 2 wherein the seed is selectively applied to the surface of the substrate.

5. The method of claim 1, metallizing the permanent plating resist after step e to provide circuitry atop the permanent plating resist.

6. The method of claim 1, wherein the permanent plating resist has a solvent content of from about 5 to 30% and comprises an epoxy resin system comprising:
   from 20 to 40% of phenoxy polyol resin having a molecular weight of from about 60,000 to 90,000;
   from about 25 to 30% of an epoxidized multifunctional bisphenol A formaldehyde novolac resin having a molecular weight of from about 5,000 to 7,000;
   from about 35 to 50%, of a diglycidyl ether of bisphenol A having a molecular weight of from about 1,000 to 1,700; and
   from about 0.1 to 15 parts by weight of the total resin weight, a cationic photoinitiator;
wherein the metal is copper.

7. A method for electrolessly plating metal comprising the following steps:

a. providing:
   an uncured, photoimagable, dielectric, permanent plating resist comprising an epoxy resin system comprising:
      from about 10 to 80% of phenoxy polyol resin which is the condensation product of epichlorohydrin and bisphenol A, having a molecular weight of from about 40,000 to 130,000;
      a. from about 20 to 90% of an epoxidized multifunctional bisphenol A formaldehyde novolac resin having a molecular weight of from about 4,000 to 10,000;
      from 0 to 50% of a diglycidyl ether of bisphenol A having a molecular weight of from about 600 to 2,500; and
      from about 0.1 to 15 parts by weight of the total resin weight, a cationic photoinitiator;
b. applying the permanent plating resist on the substrate;
c. photoimaging the permanent plating resist to form apertures in the permanent plating resist wherein said apertures are aligned with portions of the circuitry of the substrate; and,
d. electrolessly plating metal into the apertures in the permanent plating resist, wherein the metal is selectively plated onto the circuitry of the substrate.

8. A method of claim 7, further comprising the step of:
e. attaching components to features of substrate, wherein the permanent plating resist remains on the substrate during steps d and e.

9. The method of claim 7, wherein the metal is gold.

10. The method of claim 7, wherein the permanent plating resist has:
   from 20 to 40% of phenoxy polyol resin having a molecular weight of from about 60,000 to 90,000;
   from about 25 to 30% of an epoxidized multifunctional bisphenol A formaldehyde novolac resin having a molecular weight of from about 5,000 to 7,000;
   from about 35 to 50%, of a diglycidyl ether of bisphenol A having a molecular weight of from about 1,000 to 1,700; and
   from about 0.1 to 15 parts by weight of the total resin weight, a cationic photoinitiator;
wherein the metal is copper.

11. The method of claim 10, wherein the phenoxy polyol resin has an epoxide value of about 0.03 equivalents per kg, a weight per epoxide of about 37,000 and a glass transition temperature of about 98° C.;
   the epoxidized multifunctional bisphenol A formaldehyde novolac resin has an epoxide value of about 4.7 equivalents per kilogram, as weight per epoxide of about 215 and a melting point of about 82° C.; and
   the diglycidyl ether a bisphenol A has an epoxide value of about 1.5 equivalents per kilogram, a weight per epoxide of about 675 and a melting point of about 97° C.

12. A circuitized structure comprising:
a. a circuitized substrate;
b. a first layer of metal features disposed on the substrate;
c. a cured, photoimaged, permanent plating resist having photoimaged apertures disposed therein 1 said permanent plating resist disposed on the substrate,
wherein the permanent plating resist comprises an epoxy resin system comprising:
   i. from about 10 to 80% of phenoxy polyol resin which is the condensation product of epichlorohydrin and bisphenol A, having a molecular weight of from about 40,000 to 130,000;
   ii. from about 20 to 90% of an epoxidized multifunctional bisphenol A formaldehyde novolac resin having a molecular weight of from about 4,000 to 10,000;
   iii. from 0 to 50% of a diglycidyl ether of bisphenol A having a molecular weight of from about 600 to 2,500; and
   iv. less than 15% of a cationic photoinitiator; and less than about 8% solvent;
f. electrolessly plated gold, disposed on portions of the metal features, and said gold disposed in the apertures;
g. circuitry disposed on, and adherent to the permanent plating resist, the circuitry on the permanent plating resist being electrically connected to the circuitry disposed on the substrate; and
h. electrical components disposed atop the permanent plating resist and in electrical contact with the electrolessly plated gold features.

13. The circuitized structure of claim 12, wherein there is:
from 20 to 40% of phenoxy polyol resin having a molecular weight of from about 60,000 to 90,000;
from about 25 to 30% of an epoxidized multifunctional bisphenol A formaldehyde novolac resin having a molecular weight of from about 5,000 ,to 7,000;
from about 35 to 50%, of a brominated diglycidyl ether of bisphenol A having a molecular weight of from about 1,000 to 1,700.

14. The circuit board of claim 13, wherein:
the phenoxy polyol resin has an epoxide value of about 0.03 equivalents per kg, a weight per epoxide of about 37,000 and a glass transition temperature of about 98° C.;
the epoxidized multifunctional bisphenol A formaldehyde novolac resin has an epoxide value of about 4.7 equivalents per kilogram, as weight per epoxide of about 215 and a melting point of about 82° C.;
the diglycidyl ether a has an epoxide value of about 1.5 equivalents per kilogram, a weight per epoxide of about 675 and a melting point of about 97° C.; and
about 5 parts by weight of the resin weight complex triarylsulfonium hexafluoroantimonate salt photoinitiator.

15. The circuitized structure of claim 13, wherein the circuitized structure is a printed wiring structure.

16. A circuitized structure comprising:
a. a circuitized substrate;
b. a cured, photoimaged, permanent plating resist having photoimaged apertures disposed therein said permanent plating resist disposed on the substrate,
wherein the permanent plating resist comprises an epoxy resin system comprising:
   i. from about 10 to 80% of phenoxy polyol resin which is the condensation product of epichlorohydrin and bisphenol A, having a molecular weight of from about 40,000 to 130,000;
   ii. from about 20 to 90% of an epoxidized multifunctional bisphenol A formaldehyde novolac resin having a molecular weight of from about 4,000 to 10,000;
   iii. from 0 to 50% of a diglycidyl ether of bisphenol A having a molecular weight of from about 600 to 2,500; and
   iv. less than 15% of a cationic photoinitiator; and less than about 8% solvent;

c. electrolessly plated copper, disposed on the substrate, and said copper disposed in the apertures of the photoimaged permanent plating resist; and d. circuitry disposed on, and adherent to the permanent plating resist, the circuitry on the permanent plating resist being electrically connected to the electrolessly plated copper.

17. The circuitized structure of claim 16, wherein there is:

from 20 to 40% of phenoxy polyol resin having a molecular weight of from about 60,000 to 90,000;

from about 25 to 30% of an epoxidized multifunctional bisphenol A formaldehyde novolac resin having a molecular weight of from about 5,000 to 7,000;

from about 35 to 50%, of a brominated diglycidyl ether of bisphenol A having a molecular weight of from about 1,000 to 1,700.

18. The circuit board of claim 17, wherein:

the phenoxy polyol resin has an epoxide value of about 0.03 equivalents per kg, a weight per epoxide of about 37,000 and a glass transition temperature of about 98° C.;

the epoxidized multifunctional bisphenol A formaldehyde novolac resin has an epoxide value of about 4.7 equivalents per kilogram, as weight per epoxide of about 215 and a melting point of about 82° C.;

the diglycidyl ether a has an epoxide value of about 1.5 equivalents per kilogram, a weight per epoxide of about 675 and a melting point of about 97° C.; and about 5 parts by weight of the resin weight complex triarylsulfonium hexafluoroantimonate salt photoinitiator.

19. The circuitized structure of claim 17, wherein the circuitized structure is a printed wiring structure.

20. A circuitized structure comprising:

a. a circuitized substrate, b. a first layer of metal features disposed on the substrate, c. a cured, photoimaged, permanent plating resist having photoimaged apertures disposed therein, said permanent plating resist disposed on the substrate, wherein the permanent plating resist comprises an epoxy resin system comprising:

i. from about 10 to 80% of phenoxy polyol resin which is the condensation product of epichlorohydrin and bisphenol A, having a molecular weight of from about 40,000 to 130,000, ii. from about 20 to 90% of an epoxidized multifunctional bisphenol A formaldehyde novolac resin having a molecular weight of from about 4,000 to 10,000;

iii. from 0 to 50% of a diglycidyl ether of bisphenol A having a molecular weight of from about 600 to 2,500; and iv. less than 15% of a cationic photoinitiator; and less than about 8% solvent;

f. electrolessly plated gold, disposed on portions of the metal features, and said gold disposed in the apertures;

g. electrical components disposed atop the permanent plating resist and in electrical contact with the electrolessly plated gold features.

* * * * *